(12) United States Patent
Simonov

(10) Patent No.: US 10,416,210 B2
(45) Date of Patent: Sep. 17, 2019

(54) METHOD FOR MEASURING DYNAMICS OF A FLOW OF ENERGY AND RELEVANT DEVICE AND SYSTEM

(71) Applicant: S.I.SV.EL. SOCIETA' ITALIANA PER LO SVILUPPO DELL'ELETTRONICA S.P.A., None (TO) (IT)

(72) Inventor: Mikhail Simonov, Turin (IT)

(73) Assignee: Fondazione Links—Leading Innovation & Knowledge for Society, Turin (IT)

( * ) Notice: Subject to any disclaimer, the term of this patent is extended or adjusted under 35 U.S.C. 154(b) by 398 days.

(21) Appl. No.: 14/910,411

(22) PCT Filed: Aug. 6, 2014

(86) PCT No.: PCT/IB2014/063734
§ 371 (c)(1),
(2) Date: Feb. 5, 2016

(87) PCT Pub. No.: WO2015/019299
PCT Pub. Date: Feb. 12, 2015

(65) Prior Publication Data
US 2016/0187399 A1 Jun. 30, 2016

(30) Foreign Application Priority Data

Aug. 7, 2013 (IT) .............................. TO2013A0678

(51) Int. Cl.
*G01R 22/00* (2006.01)
*G01D 4/00* (2006.01)
(52) U.S. Cl.
CPC .............. *G01R 22/00* (2013.01); *G01D 4/00* (2013.01)

(58) Field of Classification Search
CPC .................................. G01R 22/00; G01D 4/00
(Continued)

(56) References Cited

U.S. PATENT DOCUMENTS

2010/0318306 A1   12/2010   Tierney et al.
2012/0271576 A1   10/2012   Kamel et al.

FOREIGN PATENT DOCUMENTS

WO    2011/058326 A2       5/2011
WO    2012/090169 A1       7/2012
WO    WO 2012090169 A1 *   7/2012   ............. G01D 4/004

OTHER PUBLICATIONS

Simonov, Event-Driven Communication in Smart Grid, Jun. 2013, IEEE Communications Letters, vol. 17.*

(Continued)

*Primary Examiner* — Alexander Sofocleous
*Assistant Examiner* — Alfredo Bermudez Lozada
(74) *Attorney, Agent, or Firm* — Workman Nydegger

(57) ABSTRACT

A method for measuring a measurable flow of energy includes measuring, by ways of a measuring device belonging to a distribution network, a first "time-driven" or TDM measurement component obtained at predetermined time intervals, the first TDM measurement component including data related to physical parameters of said measurable flow of energy; measuring, by way of the measuring device, a second "event-driven" or EDM measurement component consolidated upon the occurrence of a significant change in at least one physical parameter of the flow of energy, the second EDM measurement component including data related to the physical parameters of the measurable flow of energy; combining the first TDM measurement component and the second EDM measurement component into a time (Continued)

sequence in order to control and manage an energy trend of the flow of energy in the distribution network in accordance with business logics.

15 Claims, 7 Drawing Sheets

(58) Field of Classification Search
USPC .................................................. 702/62, 57
See application file for complete search history.

(56) References Cited

OTHER PUBLICATIONS

Jachimiski et al., Event-based and time-triggered energy consumption data acquisition in building automation, IEEE, Jun. 2015.*
Simonov, Hybrid Scheme of Electricity Metering in Smart Grid, Jun. 2014, IEEE Xplore.*
International Search Report dated Dec. 16, 2014, issued in PCT Application No. PCT/IB2014/063734, filed Aug. 6, 2014.
Written Opinion dated Dec. 16, 2014, issued in PCT Application No. PCT/IB2014/063734, filed Aug. 6, 2014.

* cited by examiner

METHOD FOR MEASURING DYNAMICS OF A FLOW OF ENERGY AND RELEVANT DEVICE AND SYSTEM

BACKGROUND OF THE INVENTION

1. Field of the Invention

The present invention relates to a method for measuring the dynamics of a flow of energy, as well as to the associated device and system. In particular, the method concerns the observation and analytical measurement of a flow of energy and/or fluids in motion, such as, for example, gas, water or another form or substance.

2. Present State of the Art

Cyber Physical Systems, or CPS, are known in the art, which comprise physical entities that carry out a given function and computational elements that control said physical entities (see Edward A. Lee. "Cyber Physical Systems: Design Challenges" in ISORC, pages 363-369, 2008). One example of such CPS systems is the intelligent distribution network for electric energy, gas, water or any other physical flow or resource. The CPS system comprises a distribution network for resource flow distribution and a computer network for real-time distribution control. Physical entities obey physical laws (for electric energy, Ohm's law and Kirchhoff's law), and can be monitored by means of measurement processes due to some fundamental properties that require monitoring and control in order to preserve over time the correct operation and stability of the system/network made up of said entities.

It is also known that the intensity of incompressible flows that enter a distribution network must remain stable along its entire path. For this reason, a measuring controller device must be able to monitor in real time the intensity of the flow, by comparing the values at various points of said network, especially at the input and output points thereof. One example is given by an alternating-current power distribution network using devices known as phasor measurement units (PMU) and phasor data concentrators (PDC), the main task of which is to ensure the decisional process carried out by a supervision and control ("Supervisory Control And Data Acquisition", or SCADA) system.

Computer devices which are most commonly used in data acquisition systems for network control are PMUs and RTUs, or "Remote Terminal Units". Such devices operate in real time but generate a lot of data, sending up to thirty packets per second and bringing the data traffic to a high, or even excessive, level.

For this reason, said PMU/PDC and RTU devices, though accurate in their measurements, cannot be employed in all network nodes (of the order of millions) because the data traffic would otherwise become so high as to be impossible to manage. Therefore, just a limited number of nodes, located on the main network backbones, are currently equipped with PMU devices, the use of which is planned according to the limits imposed by the communication network, while all other terminal nodes of the resource flow distribution network are equipped with a simple electronic meter that only carries out infrequent accounting operations not including any network control activities.

This technological limit explains why the terminations of resource distribution networks do not implement full monitoring and detection of the physical entities of the resource flow.

Typically the distribution network control centre performs a periodic scan (generally every 2-4 seconds) of the nodes equipped with real-time measuring devices in order to acquire the values of control parameters (energetic levels of the flow). The technical problem lies in the fact that circumstances which are relevant for control purposes (events) occur during a period that is much shorter than the scan cycle, thus not being visible to the control centre. Energy quality monitoring provides a special mode (called "sequence-of-event recording") for recording the events that occur, which stores into the local memory of the measuring device all the history of what happened in the recent past. Even in the presence of this special mode, data sets may still not be immediately available to the central controller, often arriving late.

The availability of full monitoring of all remote nodes is of vital importance for intelligent networks to timely control the energy production from renewable sources in distributed mode. Unlike centralized generation, which is historically controllable via mechanisms known in the art, a flow of energy entering the network through a remote node that is only equipped with an electronic meter, i.e., without an RTU or a PMU, cannot be monitored at present.

Some mathematical models are also known for observing the effects of causes that may jeopardize the functionality and/or the stability of the distribution network. For example, in an alternating-current power distribution network, it is possible to measure the revolution speed (frequency) of power generators, which is reduced when energy consumption increases and is increased when consumption decreases. However, at present no technical solution exists that allows monitoring the final segments (the so-called "last mile") of the low-voltage network. Several electronic devices for energy measurement exist which can communicate the meter readings, but none of such devices can operate in an event-driven mode by using the architectures of the EDA ("Event-Driven Architecture") and/or SOA ("Service-Oriented Architecture") systems. In most current solutions, the minimum limit is the sampling per second, and the data are available "upon request" via a scanning operation.

Indirect network control methods are based on a simple approach: wherever the network is stable no adjustment is made, while by continuously estimating the network's state it is possible to intervene should some actual measurements be different from the estimated values. In practice, the problem is attributable to the large number of points to be monitored and their respective positions.

The aim is to find a technologic solution with low computational complexity that allows the network topology to be directly and fully monitored.

It is also known that there are electronic devices for measuring flows of energy (sensors for electric energy, gas, water, etc.) that sample the flow with a high time resolution to obtain instantaneous values of physical entities, store them, and transmit them in the network at regular time intervals ("time-driven" method). In this manner, a large volume of data is exchanged between said devices and a central computer located in the same network. The measured quantity of energy E(t) can be expressed as the arithmetic sum of the single energy values $E_i$, i.e.:

$$E(t) \approx \sum_{i=0}^{t} E_i$$

For example, the instantaneous power values multiplied by a short observation time provide energy values that can be defined as "instantaneous". As the index i changes, the accuracy of the method and the adherence of the series $E(t_k)$ to the series $E(t)$ may vary significantly, introducing a measurement error $\epsilon(t)=|E(t)-\Sigma E(t_k)|$. Digital electronic devices for energy measurements utilize the discrete formula for calculating their output values.

The precision of the numerical calculation in the discrete space is preserved by a very high sampling frequency in the device (some MHz). Considering the limited quantity of internal memory of the device, only a few mean values aggregated during rather long time periods are stored and made externally available. Such values are also referred to as "pseudo-measurements". An infinite numerical series of ever-increasing values $\{E^{TDM}_1, E^{TDM}_2, E^{TDM}_3, \ldots, E^{TDM}_i\}$ is thus obtained, where each $E^{TDM}_i < E^{TDM}_{i+1}$, represents the result of the measurement method known as "time-driven" method. In order to know just the quantity of energy exchanged during a certain period of time $[t_1, t_2]$, two measurements $E(t_2)$ and $E(t_1)$ and the calculation procedure $\Delta E_{12}=E(t_2)-E(t_1)$ are necessary and sufficient; the latter is typically used for invoicing.

Given the large number of meters in a distribution network (tens of millions or more) and the very high sampling frequency required for ensuring measurement accuracy, the "time-driven" method known in the art cannot be used by the network in real time because of the excessive volume of data that would otherwise be created. In order to reduce the data traffic, the meter accumulates the integral sums of the energy into its own internal memory, which task requires some time $\Delta t=[t_i-t_{i-1}]$ that causes a natural delay in the communication with the network. For consolidating and communicating energy measurements in the network, a rather long time interval is therefore chosen, e.g., fifteen minutes. Depending on the implementation, which may vary according to the network's size, these "pseudo-measurements" may be (since they are averages) either transmitted immediately to the control computer or accumulated into the local memory of the measuring device and then transmitted in delayed mode, e.g., at the end of the day, week or month. Thus, some significant measurements may be lost, i.e., those indicating the actual energy distribution in the network; therefore, energy flow changes are not traced, while the network node equipped with such a meter remains unmonitored throughout the time period $\Delta t$. This makes it impossible to know the actual trend of the flow of energy, preventing a timely control of the entire network or a portion thereof.

According to the prior art, locally measured values can be transmitted in the network in two modes:
- in "time-driven" mode with the series of measurements ("pseudo-measurements") $\{E^{TDM}_1, E^{TDM}_2, E^{TDM}_3, \ldots, E^{TDM}_i\}$, by using infrequent time sampling;
- in "event-driven" mode with the series of measurements $\{E^{EDM}_1, E^{EDM}_2, E^{EDM}_3, \ldots, E^{TDM}_i\}$ in real time. In this case, these are actual measurements which are sent in compressed form upon every significant change in the flow, observing and eliminating any adjacent duplicates.

This approach offers the advantage of reducing the amount of data transmitted in the network, thus making it possible to use meters for the same purposes as those offered by SCADA systems assisted by PMU-type devices. However, since it only provides differential values, there is a risk that some data packets will be lost, so that the period following the one during which the loss has occurred cannot be observed.

SUMMARY OF THE INVENTION

It is therefore an object of the present invention to provide a method, a device and a system for measuring the dynamics of a flow of energy, which is adapted to transmit to a receiver, e.g., an electric company, a reduced amount of data related to said flow of energy associated with a measuring device.

It is a further object of the present invention to provide a method, a device and a system for measuring the dynamics of a flow of energy which ensures a faster calculation of said dynamics and has less computational complexity, so that the topology of a distribution network can be directly and fully monitored.

It is yet another object of the present invention to provide a method, a device and a system for measuring the dynamics of a flow of energy that allows analytical tracing of all significant changes in the flow of energy.

These and other objects of the invention are achieved by a method, a device and a system for measuring the dynamics of a flow of energy as claimed in the appended claims, which are intended to be an integral part of the present description.

In brief, the present invention describes a method, a device and a system for measuring the dynamics of a flow of energy, wherein the energy measuring device is configured for obtaining a functionality for monitoring and managing the flow dynamics, i.e., changes in terms of flow parameters and quality (e.g., energy, power or the like). In particular, the method according to the present invention uses two measurement components, a first component calculated by using the "time-driven" or TDM mode (which provides absolute values), and a second component calculated by using the "event-driven" or EDM mode (which provides incremental values/variations). The method provides for combining the first and second components into a time sequence for the purpose of observing, measuring and quantifying in real time the physical entities of the flow (which is generally non-stationary) and the characteristics thereof, by means of a very small amount of data (e.g., measurement data and meta-information to be sent in the network).

This minimizes the measurement error and reduces the risk of losing the capability of monitoring the network's topology because of a possible congestion of the same. The method also provides for compressing the data transmitted in the network and reconstructing the original numerical time sequence of the measurements, which is geometrically interpreted as a "load shape" that ensures real-time network management operability. By approximating at best this numerical series (curve) by means of the points of variation of the flow of energy, it is minimized the time period between the occurrence of flow changes on remote nodes and the knowledge of such occurrences, which are immediately communicated to a network Agent entrusted with the task of controlling said network, and the possibility for the Agent to rapidly take the necessary control actions in order to mitigate any possible consequences (e.g., in terms of stability of saturated networks).

Further features of the invention are set out in the appended claims, which are intended to be an integral part of the present description.

BRIEF DESCRIPTION OF THE DRAWINGS

The above objects will become more apparent from the following detailed description of a method, a device and a system for measuring the dynamics of a flow of energy, with particular reference to the annexed drawings, wherein.

DETAILED DESCRIPTION OF THE PREFERRED EMBODIMENTS

Figure 1:
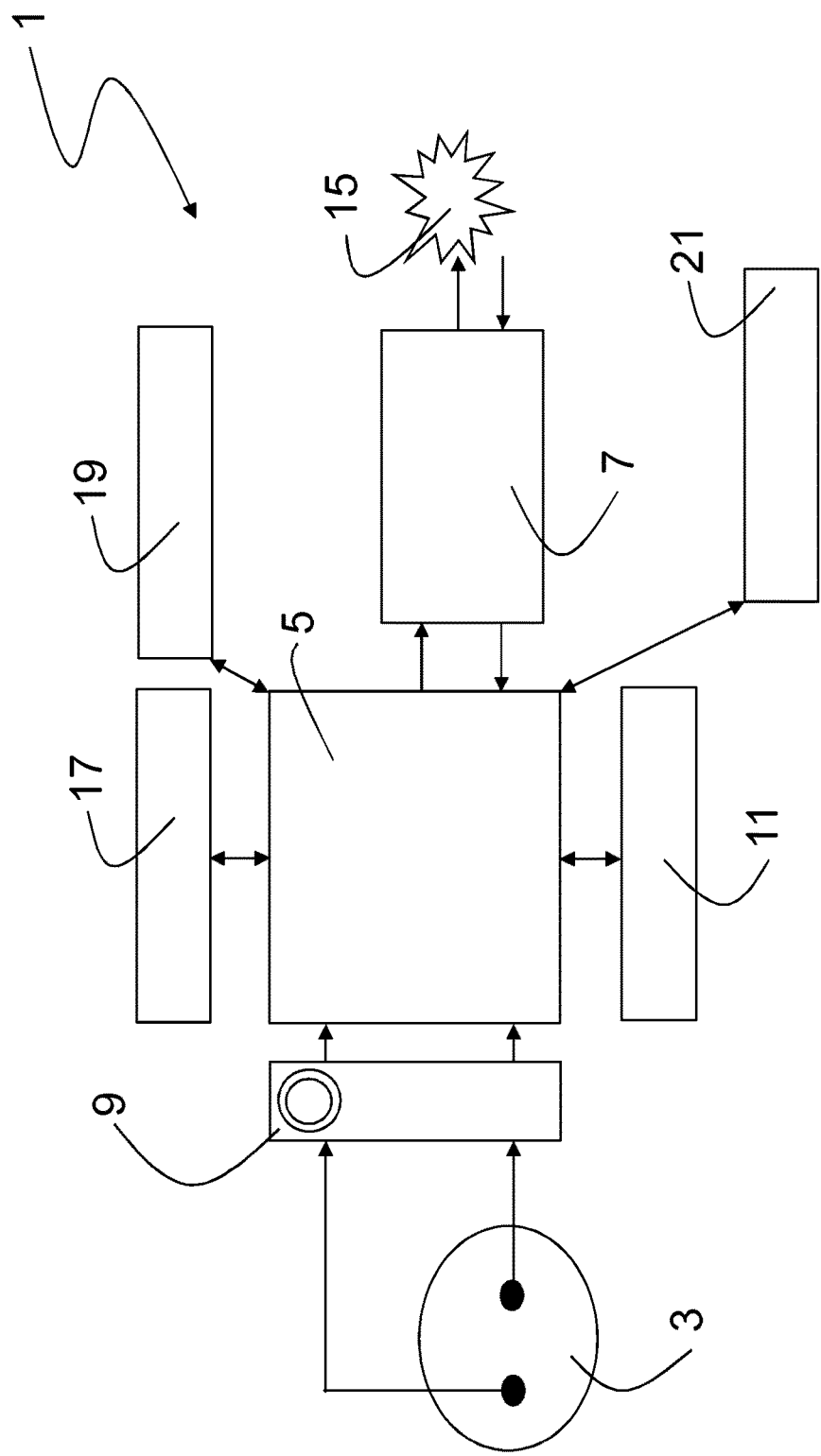
FIG. 1 shows a block diagram of a device for measuring the dynamics of a flow of energy according to the invention.

With reference to FIG. 1, there is shown a device 1 for measuring a flow of energy according to the present invention, which comprises: a source 3 of an energy signal to be measured; a digital measurement circuit 5 comprising an integrated microchip with an on-board microprocessor; a bidirectional communication unit 7 for transmitting messages comprising measurement data to a network 15 and receiving control messages, which uses a suitable protocol that ensures that the messages will arrive immediately at the receiver; means 9 for detecting an energy value of the flow; memory means 11; power supply means 19 for supplying power to the device 1; remote control actuating means 21 (e.g., an AMM or "Automatic Meter Management" control relay); and a user interface (not shown), e.g., an LCD display, an acoustic and/or optical indicator, an actuator for disconnecting the energy flow supply, if necessary, or a distributed user interface accessible by means of fixed or mobile network devices, such as a smartphone or a tablet.

The means 9 for detecting an energy value of the flow comprise an analog sensor or module or another sensor suitable for detecting characteristic physical parameters of the flow of energy. For example, when measuring a flow of electric energy, the means 9 are adapted to detect an electric voltage and an electric current, and comprise a specific physical sensor (e.g., a Rogowski coil, a current transformer, a resistive shunt, or the like).

The device 1 may also comprise signalling means 17, in particular a buzzer, or an optical indicator, or a display (e.g., LED, LCD or other types).

The device 1 according to the invention is similar to a traditional electronic meter, and therefore it has the same analog inputs (means 9) and the same energy measurement algorithm, but it additionally provides the network 15 with a stream of digital messages that describe the flow of energy over time and the dynamics thereof.

The device 1 implements automatic reading (AMR or "Automatic Meter Reading") and management (AMM or "Automatic Meter Management") functionalities. The device 1 sends the events in "push" mode by using any network communication protocol that can efficiently support such mode. However, it may store the measurement data in the memory means 11 for a certain period of time, which data can be presented via the user interface.

The communication unit 7 of the device 1 preferably operates on two communication channels, a first one of the "pull" type and a second one of the "push" type. To ensure compatibility with the prior art, the data stream detected in TDM mode operates on the first channel in "pull" mode, with or without implementing any remote control commands. To ensure real-time control, the EDM event flow operates on the second channel in "push" mode. In both cases, this communication is obtained, for example, from a combination of wired/PLC and wireless/GSM/GPRS/EDGE/UMTS/LTE/Wi-Fi/5G or the like.

The device 1 according to the invention, therefore, transmits the events (values of the physical parameters of the flow of energy) in the network 15 at predetermined time intervals (e.g., every 15 minutes or so), and also when significant dynamics, or changes, occur in the flow of energy, i.e., when one or more of the detected parameters exceed a predetermined threshold (EDM mode). In other words, an event occurs at the end of the preset time Δt1 (TDM) and also every time a significant change in the flow of energy ΔE(t) is recorded.

In other words, the device 1 according to the present invention is adapted to:

measure/calculate the first TDM, or "time-driven", measurement component at predetermined intervals, said first TDM measurement component comprising data related to physical parameters of said measurable flow of energy;

measure/calculate at least one second EDM, or "event-driven", measurement component upon the occurrence of a significant change in at least one physical parameter of said flow of energy, said at least one second EDM measurement component comprising measurement data related to said physical parameters of said measurable flow of energy;

transmit, by means of the communication unit 7, said first TDM measurement component and said at least one second EDM measurement component in order to combine them into a time sequence and to control and manage an energy trend of said flow of energy in said distribution network 15.

This immediate mode of transmission of the EDM components can be defined as hybrid ("Hybrid Metering Method" or HMM). As an alternative, when the device 1 records EDM events into the memory means 11, it sends the TDM message and an accumulated list of EDM messages put together, for example, into a single data block, waiting for the next predetermined time interval; this communication variant based on time intervals, with delayed delivery of the events that have occurred, is referred to as "Time-Driven Method with Delayed delivery of Events" or TDMDE. For compatibility with prior management modes, an attribute called "MsgType" is added to each digital message (measurement data packet) to discriminate between TDM and EDM data packets, with further options reserved for possible extensions ("MsgType"={TDM, EDM, . . . }).

Figure 2:
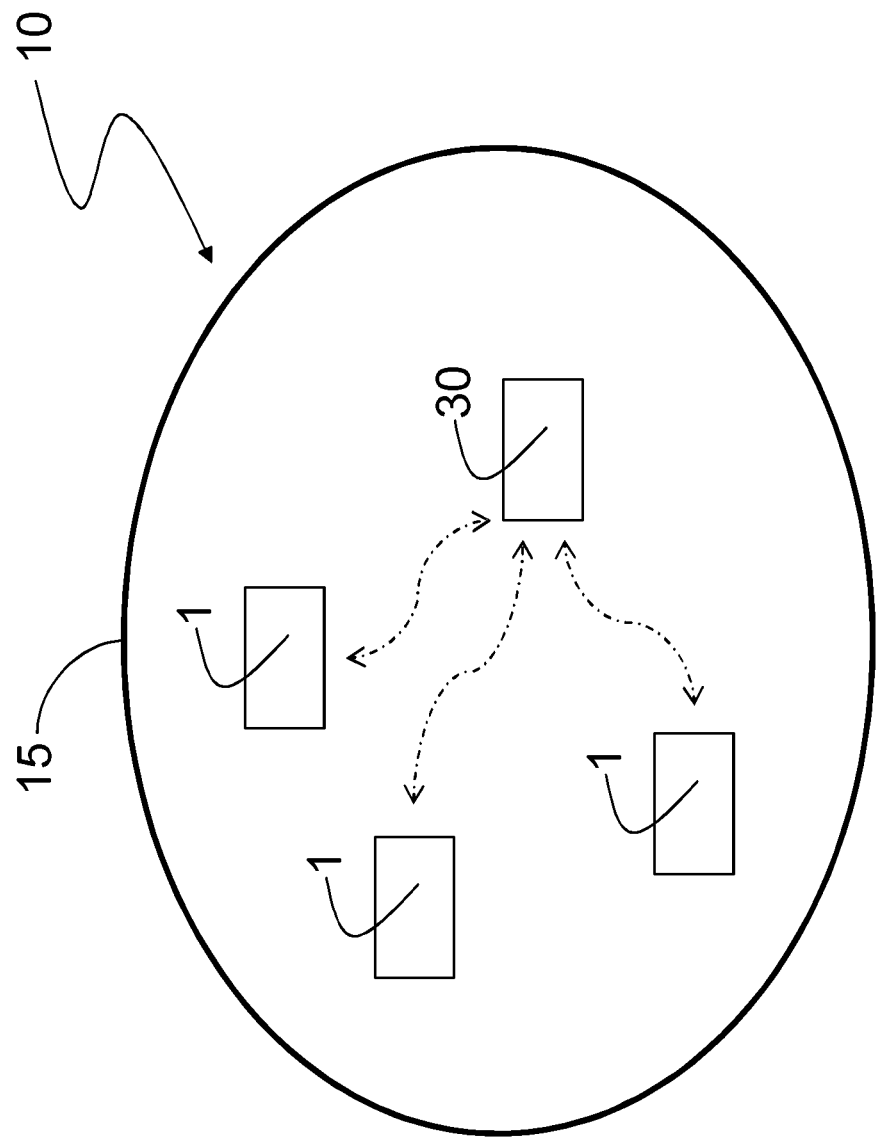
FIG. 2 shows an example of a system for measuring the dynamics of a flow of energy according to the invention.

With reference to FIG. 2, there is shown a system 10 according to the present invention. The system 10 comprises at least one measuring device 1 and a computer 30, both arranged in the network 15. The device 1 and the computer are configured for cooperating together by exchanging digital messages, for the purpose of taking control and management actions. The computer 30 may also represent a computer network, and the exchange of said digital messages may take place between such computers or anyway within said network 15.

The following will describe the peculiar functionalities of the measuring device 1 and of the computer 30.

The method according to the present invention, therefore, uses two measurement components, a first component calculated in "time-driven" or TDM mode, and a second component calculated in "event-driven" or EDM mode. The method provides for combining the first and second components into a time sequence for the purpose of observing, measuring and quantifying in real time the physical entities of the flow (which is generally non-stationary) and the characteristics thereof, by means of a very small amount of data (e.g., measurement data and meta-information to be sent in the network).

In other words, the method comprises the following steps:
measuring, by means of a measuring device 1 belonging to a distribution network 15, a first TDM, or "time-driven", measurement component at predetermined intervals, said first TDM measurement component comprising data related to physical parameters of said measurable flow of energy;
measuring, by means of said measuring device 1, a second EDM, or "event-driven", measurement component upon the occurrence of a significant change in at least one physical parameter of said flow of energy, said second EDM measurement component comprising data related to said physical parameters of said measurable flow of energy;
combining said first TDM measurement component and said second EDM measurement component into a time sequence in order to control and manage the energy trend of said flow of energy in said distribution network 15.

In view of the above, the combined method (TDM+EDM) is defined as hybrid ("Hybrid Metering Method", HMM).

Figure 3:
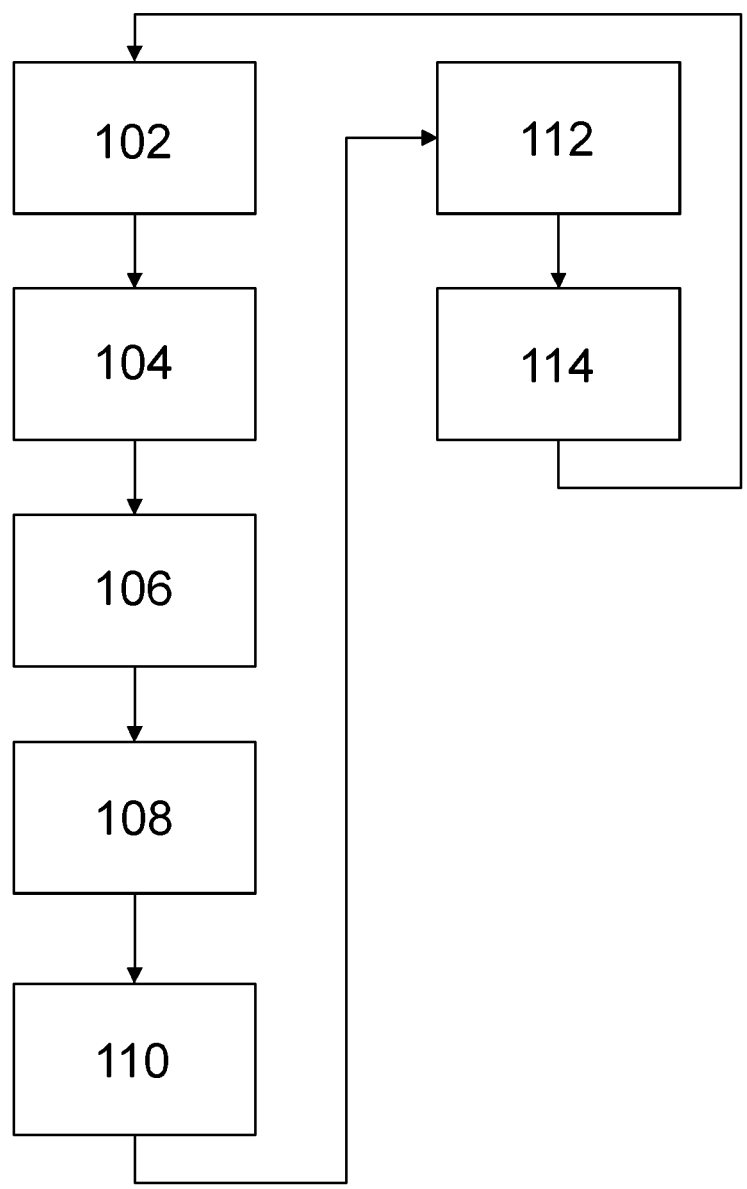
FIG. 3 shows a block diagram of a method for measuring the dynamics of a flow of energy according to the invention.

With reference to FIG. 3, the method according to the invention comprises, more in detail, the following steps:
step 102 provides for sampling a flow of energy measurable by means of a measuring device 1 belonging to a distribution network 15 of an electric company;
step 104 provides for calculating, at first regular time intervals $\Delta t_1$, integral sums ETDMi of amounts of energy, i.e., a first measurement component TDM;
step 106 provides for transmitting a digital TDM message in said network 15 by means of said measuring device 1;
step 108 provides for calculating in real time an energy change $\Delta E_i = (E_i - E_{i-1})/\Delta t_2$, where $E_i$ and $E_{i-1}$ are two values of integral sums of amounts of energy consolidated in a determined number of cycles, and where $\Delta t_2$ is a second time interval between the respective time instants when said two values of integral sums $E_i$ and $E_{i-1}$ are obtained, and where $\Delta t_2 \ll \Delta t_1$;
step 110 provides for adding said energy change $\Delta E_i$ to similar changes calculated at previous time instants in order to obtain an accumulated sum of said changes;
step 112 provides for transmitting a second measurement component EDM in said network 15 by means of said measuring device 1 in case said energy change $\Delta E_i$ and/or said accumulated sum are higher than a predetermined threshold value $\delta_E$;
step 114 provides for iterating said previous steps of the measurement method for each index i and j in order to obtain a series of hybrid values containing both said first and second measurement components $\{E^{TDM}_1, E^{EDM}_1, E^{TDM}_2, E^{EDM}_2, \ldots, E^{TDM}_i, E^{EDM}_j\}$.

The method according to the invention is compatible with the "time-driven" mode of the prior art because it is sufficient to interpose the "event-driven" numerical series $\{E^{EDM}_{i1}, E^{EDM}_{i2}, \ldots, E^{EDM}_{ij}\}$ between the pairs of energy values $E^{TDM}_i$ and $E^{TDM}_{i+1}$; also, the method provides the changes occurring in the (non-stationary) flow of energy and the exact time instant of occurrence thereof.

In addition, the method specifies when the digital messages must be communicated in the network 15, establishes a protocol for the data and for exchanging them, and indicates which operations must be carried out on the device 1 and which must be carried out by the computer 30 for controlling the non-stationary flow in real time.

The means 9 for detecting an energy value of the flow provide instantaneous energy values at a sampling frequency, in particular very high. This produces a matrix of numbers Minst(tk) that contains the values of the parameters of the flow of energy being monitored, which parameters characterize it both qualitatively and quantitatively. As a result, the measuring device 1 has all the elements necessary for observing what is happening on its network node (each measuring device 1 represents one node of the network 15). Considering, for example, a flow of electric energy, the means 9 will be one or more electricity detection sensors. The data detected by the electricity detection sensors, i.e., the energy series E(t), are included in the matrix $M_{inst}(t_k)$; for example, the parameters being monitored may be a power P(t), a voltage V(t), a current I(t), a frequency f(t), and other parameters that characterize the flow of energy and the quality thereof. Another example may be a flow of gas; in this case, the means 9 will be one or more gas sensors that provide a series of values related to parameters such as gas volume V(t), gas pressure P(t), gas temperature T(t), etc.

In any case, the matrix $M_{inst}(t_k)$ turns out to be too big to be exchanged with other network nodes or Agents, and therefore it is processed within the measuring device 1 by means of suitable algorithms (also known as microcode). The result of the processing of the matrix $M_{inst}(t_k)$ is output as a series of indicators that summarize and describe the trend over time of the flow of energy under observation.

Said processing reduces the data volume of the matrix $M_{inst}(t_k)$ by removing redundant data (the information theory states that, if one same value persists for a certain time, then the intended receiver of the communication will not need the duplicates of data repeated multiple times). The architecture suitable for this purpose is known as EDA/SOA ("Event-Driven Service-Oriented Architecture"), with the addition of some peculiarities. In the present invention, the measuring device 1 plays an active role by sending digital messages via the communication channel, while an Agent enters the channel listening state and receives all the messages associated with the events that have occurred. In addition to what is provided by the prior art, the measuring device 1 sets a rather short first time interval $\Delta t_1$, also referred to as "observation slot", during which it processes the instantaneous data and obtains specific measurements $M_{rif}(t_k)$.

In the discrete time space $T|\Delta t_1$ the device 1 keeps all the characteristics of similar devices of the prior art, because it adopts the "time-driven" mode. In order to preserve the compatibility with prior-art existing applications, a second time interval $\Delta t_2$ is set (1 second, 1 minute, a quarter of an hour, an hour, 24 hours, etc.), during which the measurements are integrated in order to obtain pseudo-measurements (mean values) to be outputted through the communication channel. In this manner, the numerical series contained in a matrix $M_{Legacy}(t_k)$ correspond to the partitioning of the discrete time space $T|\Delta t_2$ and can be sent to various external Agents. For example, in the ENEL Telegestore system, with $\Delta t_2 = 900$ seconds, the matrix $M_{Legacy}(t_k)$ would contain vectors containing 96 elements each, among which the ever-increasing series $E(t_k)$ of electric energy measurements known as "load shape".

The aim of the present invention is to capture all the instants when the flow of energy loses its stationary characteristic (i.e., when it undergoes a significant change).

As aforesaid, energy flow change events, or "occurrences", are created at the instant when a condition related to a change in the amount of energy $|\Delta E_j| > \delta_E$ arises, $\delta_E$ being a predetermined energy threshold, or a finite enumeration of thresholds $\delta_{EK}$. Said occurrence is characterized by a semantic label (change=yes) and by the time instant $t_j$ at which the event occurs. By collecting events, one obtains an Event Map that complements the measurements.

The entity U is defined as a sequence of time segments (also referred to as "chain of chunks") during which the flow of energy under observation remains stationary but delimited by time instants $t_k$ at which the flow of energy has shown significant variations, i.e., those which are relevant for the purpose of automatically controlling the network 15.

The sampling space $\Omega$ is defined as a set containing elements U with the events that have occurred in various locations in space (nodes belonging to the network 15) at different time instants $t_k$. The sampling space $\Omega$ characterizes both qualitatively and quantitatively all those locations in the spatial topology where events have occurred during which the measured flow of energy has changed.

The sampling space $\Omega$ indicates all points in the space-time where (state) transitions have occurred, which have revealed themselves as changes of the resource flow $(|\Delta E_i| > \delta_E)$, or $(|\Delta E_i| > \delta_{Ek})$ for $\forall k$ with k belonging to the set of positive integer numbers $Z^+$.

The measuring device 1 outputs a sequence of data of entities U that describes the instants at which changes have occurred in the flow of energy.

Let us designate as $\Pi$ a process for exchanging the energy measured in the location L at the time T.

The method according to the present invention transmits the elements belonging to the sampling space $\Omega$ that have been calculated on the basis of the measured quantity. In particular, the data of the sequence of time segments (chain-of-chunks) contain in the first TDM components attributes that represent the absolute values of the measured energy, whereas the second EDM components contain the relative changes in the measured quantities. All elements U explicitly indicate the time instants $\{t_i, t_{i+1}, \ldots, t_{i+k}, \ldots\}$ at which changes occur in the flow of energy, and also indicate the length of the time periods when the flow of energy remains stationary, i.e., with no variations $\{\Delta t_i, \Delta t_{i+1}, \Delta t_{i+k}, \ldots\}$. This process enables analytical energy accounting.

The method also provides for eliminating the repeated transmission of the absolute values of the measured energy (duplicated data). In case of a collision or loss of one or more EDM data packets during the data transmission, the next TDM data packet will provide a new absolute reference for continuing to monitor the events and the consequences thereof. The process for eliminating duplicates provides measurement data compression and produces a data set characterized by time-variable density.

Figure 4:
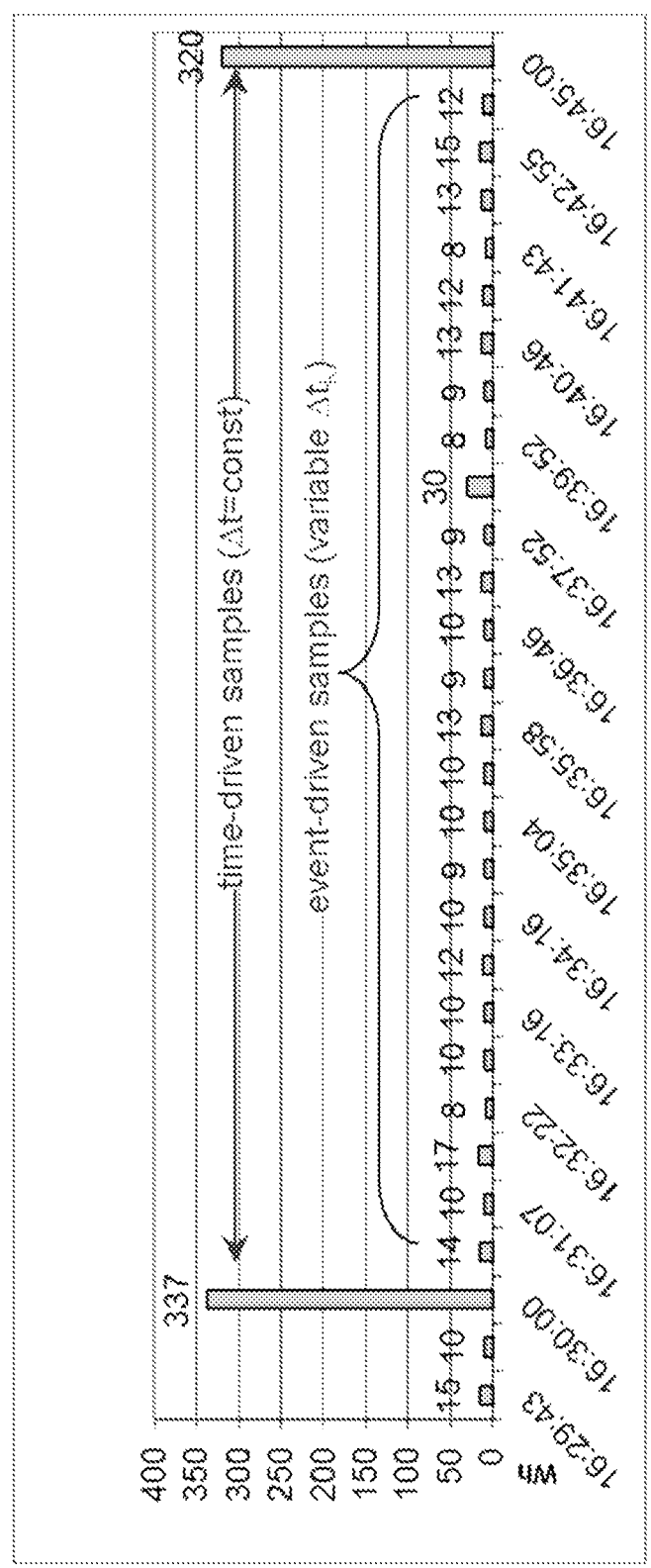
FIG. 4 shows an example of a sequence of measurement data in accordance with the present invention.

With reference to FIG. 4, there is shown an example of a sequence of measurement data in accordance with the present invention.

In case the EDM data are accumulated into the memory means 11 of the measuring device 1 and are then transmitted at a single instant, the method provides for entering, in addition to an EDM data packet, some meta-information related to the time necessary for reconstructing the correct time sequence of the events that have occurred in the load shape. This communication mode is referred to as TDMDE.

At the end of a generic time interval $\Delta t$, the TDMDE mode provides for calculating the event map. At every change occurring in the flow, a counter $n_j$ is incremented in order to calculate the total number of changes occurred during a period of time. At the end of each interval $\Delta t$, said counter $n_j$ indicates the total number of events that have occurred. The resulting number of $n_j$ characterizes the intensity of the changes occurring in the flow of energy during a time unit $\Delta t$.

The TDMDE mode then defines a parameter $n(t) = \{n_1, n_2, \ldots, n_j, \ldots\}$, called "change intensity", which is supplied together with the data packets $E^{TDM}$ by extending the latter's data structure through the addition of new attributes. The sequence of values $n(t)$ over time indicates how the intensity of the events changes along the time axis. This parameter is used for determining repetitive activities (caused by automated devices), non-repetitive activities (caused by man), and no activity (stationary state).

The whole interval of flow changes $[E_0, E_{max}]$ is divided, within the maximum limit $E_{max}$ defined by contract, into "x" equal parts. For example, if it is divided into ten equal parts (x=10), the size of each part is calculated as $(E_{max}-E_{min})/x$, i.e., the maximum allowable energy minus the minimum energy divided by x=10. In this way, x=ten independent values $\delta_i$, with index i=1,2, ... 10 are obtained, which can be used for the EDM data in order to distinguish between a "relevant" change and a "non-relevant" change. Instead of using a single threshold $\delta E$, the thresholds become $\delta_i = E_{min} + (i-1)*(E_{max}-E_{min})/x$, with i=1,2, ..., x. In the example with x=10, therefore, $\delta_i = E_{min} + (i-1)*(E_{max}-E_{min})/10$ with i=1, 2, ..., 10.

This approach imposes that in the network 15 there is a computer 30 that listens to digital messages and processes them. Said computer 30 samples time by adopting a procedure similar to that of a concentrator ("Phasor Data Concentrator" or PDC) that uses the phasors method for governing remote PMUs. Time is divided into third time intervals $\Delta t_3$, which are rather short but regular. The computer 30 listens to the network 15 during said third time intervals $\Delta t_3$ and calculates, for each one of them, the sums of parameter values provided by the remote nodes. An aggregate view of messages is thus obtained, indicating the impact caused by a plurality of remote nodes during the time unit.

In addition, both the measuring device 1 and the computer examine the trend over time of messages comprising values related to the physical parameters of the flow of energy, calculating an intensity of the stream of messages, which is defined as a number of events produced or received during a time slot.

In substance, the computer 30 observes and counts in real time network information comprising energy amount values, their changes, the speeds of the changes in the flow of energy over time, and the intensity of the message traffic, in addition to the values of flow parameters (e.g., power, volume, etc.). This network information, which can also be directly used for estimating the state of the network 15 ("state estimation"), ensures observability and controllability of the network 15 itself.

Figure 5:
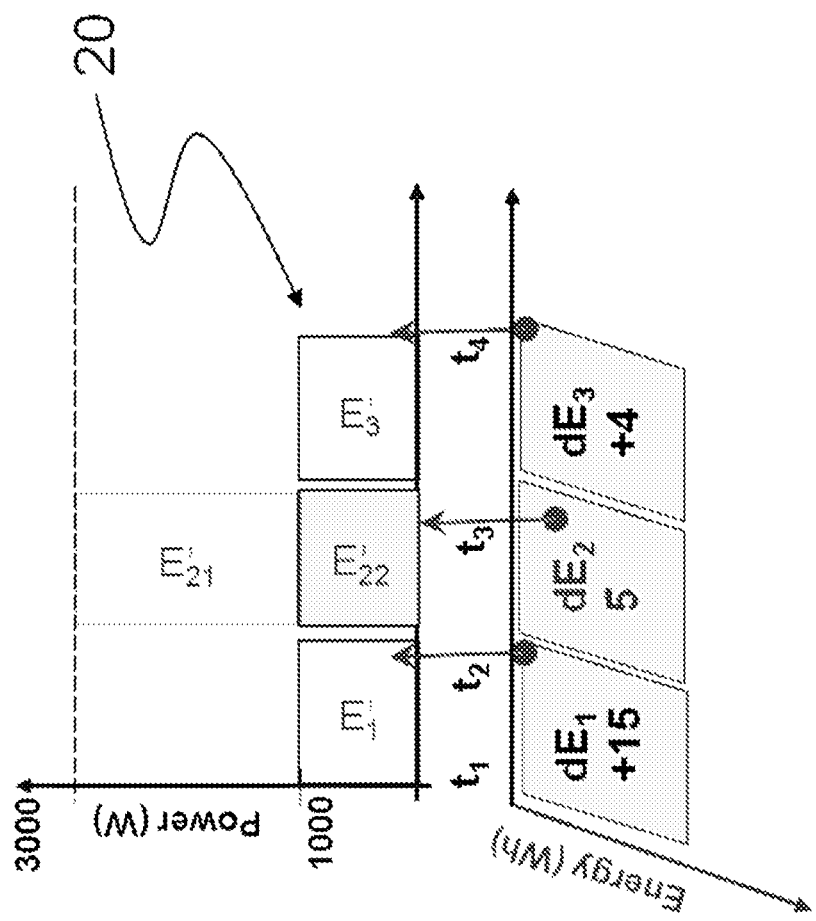
FIG. 5 shows a further example of a sequence of measurement data in accordance with the present invention.

With reference to FIG. 5, the computer 30 can, thanks to these parameters, reconstruct a posteriori the load shape 20 with good approximation. Said load shape 20 comprises a reduced number of rectangles corresponding to the partial integral energy sums.

In addition, the computer 30 produces the list of network nodes where changes in the flow occur; it also calculates the number of network nodes; then it processes a general indicator which is useful for monitoring the stability of the network 15. If the computer 30 is interfaced to an external system for controlling the network 15, it will provide said indicator to the latter.

It must be pointed out that an important feature of the method according to the present invention is the possibility of capturing also those energy changes which are apparently "null": since the energy integral comprises two components, i.e., flow energy intensity and time, an inversely proportional variation of both components might result in two identical $E_j$ and $E_{j+1}$; the timing of the change would be reported via a notification of the existence of the event $\Delta E_j$, even if $\Delta E_j$ were equal to 0. This is due to the use of variable time density. Because $dE_j$ consolidates during the period $[t_{j-1},t_j]$, whereas $dE_{j+1}$ consolidates during the period $[t_j,t_{j+1}]$, $E'(t_j)$ and $E'(t_{j+1})$ must be evaluated while taking into account that, in general, $|t_{j-1},t_j| \neq |t_{j-1},t_j|$. Let us assume, for example, that $E'_1=100$, $t_1=10$, $E'_2=200$, $t_2=5$, we will have $E_1=1000$, $E_2=1000$, $dE=E_2-E_1=0$. Although the device 1 generates and transmits event-driven values E(t), the computer 30 will also analyze the time density trend as it receives said messages. Another possibility is given by the possible time coincidence between $E^{TDM}i$ and $^{EDM}j$, even though it is much less likely to happen.

According to the method of the present invention, the device 1 and/or the computer 30 also provides for calculating changes between energy differences $\Delta E(t_k)/(t_k-t_{k-1})$ and $\Delta E(t_{k-1})/(t_{k-1}-t_{k-2})$ at adjacent time instants $t_k$, the index k ranging from 1 to $\infty$.

Figure 6:
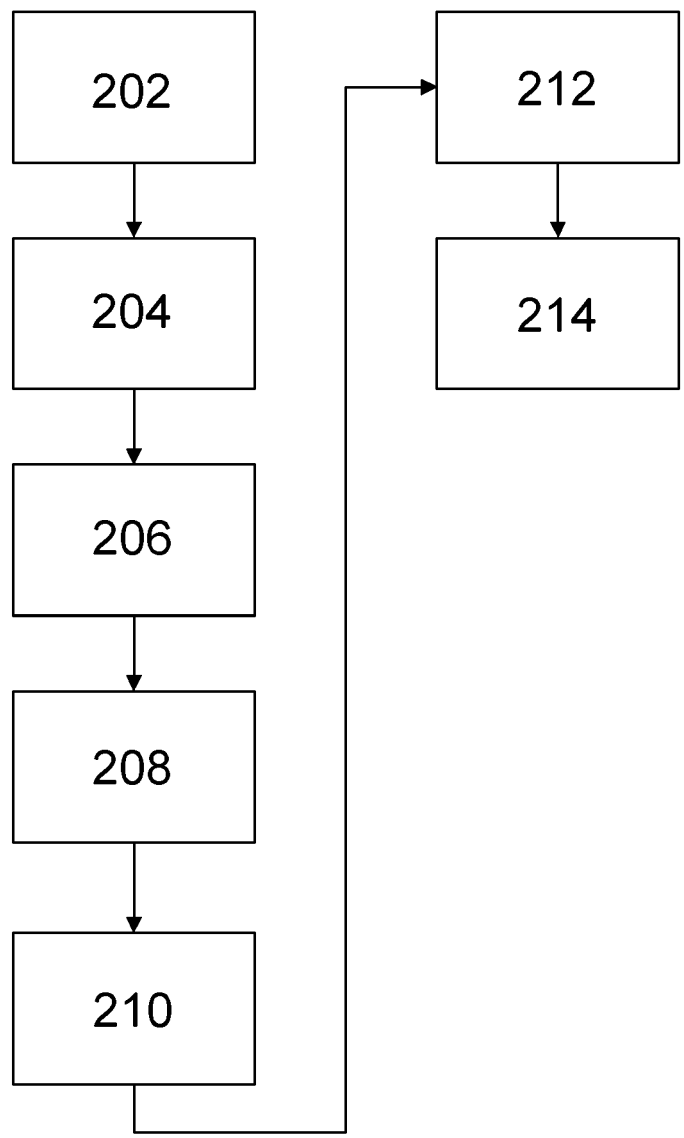
FIG. 6 shows a further block diagram of a method for measuring the dynamics of a flow of energy according to the invention.

The collaborative system is based on the components (1) and (30). With reference to FIG. 6, the following process takes place on the side of the computer 30.

At step 202 the parameters used for calculating the amounts of energy, the changes in the flow of energy, the timing thereof, and the intensity of the stream of messages are initialized:

"$\Delta t_3$": time interval used as a time slot on the side of the computer 30;

"$E_i$": amount of energy exchanged in the current period;

"$\Delta E_i$": energy changes that have occurred in the current period;

"$N_i$": number of changes that have occurred in the current period on the remote nodes.

The index i indicates the current period.

At step 204, the counter k is incremented by one unit.

At step 206, the absolute values of the amounts of energy $E_i$ received by the remote nodes are summed $E(t_k)=E(t_k)+E_i$; first components $E^{TDM}$ are then produced.

At step 208, the energy changes received by the remote nodes are summed $\Delta E(t_k)=\Delta E(t_k)+\Delta E_i$; second components $E^{EDM}$ are then produced.

At step 210, the variations between adjacent energy differences $\Delta E(t_k)/(t_k-t_{k-1})$ and $\Delta E(t_{k-1})/(t_{k-1}-t_{k-2})$ are also calculated.

At step 212, the number of changes in the flow is calculated, if more than 0, i.e., "IF($|\Delta Ei|>0$) THEN $N(t_k):=N(t_k)+1$"; said number N represents the intensity of the stream of digital messages $E^{EDM}$.

At step 214, the computer 30 closes the third time interval $\Delta t_3$; it then processes the obtained series $\{E_i, \ldots\}$, $\{\Delta E_i, \ldots\}$, $\{N_i, \ldots\}$ in order to control the network 15. During this step, the computer 30 triggers a call to an external decision-making application (which is not an object of the present invention), which will possibly take control actions after comparing energy availability and demand in one or more network segments.

Referring back to FIG. 5, in order to calculate the energy $\Delta E_i$ it is possible to make the first derivative of the power of the flow. The partial integral sums $\Sigma_i=\Delta E_i*\Delta t_i$ represent the rectangles of the load shape 20.

When the measuring device 1 remains silent, the computer 30 and the network 15 assume that the flow of energy of the respective remote node is stationary. In the absence of transmitted data, the computer 30 maintains, by logic inference, that identical energy values $E^{TDM}_i=E^{TDM}_{i+1}=$const persist on the remote nodes. In such a case, it is possible to minimize the amount of data by eliminating all unnecessary repeated duplicates ($E^{TDM}_i=E^{TDM}_{i+1}=E^{TDM}_{i+2}= \ldots$).

In other words, the computer 30 is adapted to communicate with control systems and/or with state estimators of the distribution network 15, providing them with a reduced amount of network information useful for cooperative control of the network 15 itself; said network information, as aforementioned, is therefore based on the knowledge of events occurred on at least one remote node belonging to the distribution network 15.

It is worth specifying that this step is of fundamental importance because, unlike the prior art, it allows estimating the state of the network 15. The prior-art formula z=h(x)+e [see F. C. Schweppe, J. Wildes, "Power System Static-State Estimation", Transactions on PAAS, Vol. PAS-89, n.1, January 1970, pp. 120-135] containing the state variable vector x, the measurement vector z, the error vector e, and the non-linear equations of the power flow h, now receives a contribution due to what has been described above. During the previous time slot, the computer 30 has actually been operating with z(t−1). The switching from z(t−1) to z(t), consolidated at the end of the current time slot, is determined by the above calculation. In the absence of messages, the computer 30 can assume that z(t)=z(t−1); hence the computer 30 will comprehend, by logic inference, that the network 15 is stable.

If a series of messages received and processed by the computer 30 contain energy flow measurement data that produce a sum close to zero (positive flow variations occurred on some nodes have been compensated for by negative flow variations occurred on other nodes), then the computer 30 can assume that z(t)≈z(t−1). In both cases it becomes possible to avoid the costly calculation of the above prior-art formula z=h(x)+e that uses the non-linear functions h. Only a significant general variation in the measurement parameters, such that $E(t)>\delta_E$, will produce the need for a new estimate of the state of the network 15 by using h(x). However, in this case as well the vector x(t) is only slightly different from x(t−1) because the respective changes are those caused by just a few messages received by some nodes during the last time slot $\Delta t$.

The persistence of constant values $E^{TDM}_i=E^{TDM}_{i+1}= \ldots$ at the end of every $\Delta t$ appropriately set, even if they are omitted, geometrically determines a horizontal power line of the load shape 20 along the time axis; the height of the rectangle corresponds to the power of the flow, and is calculated by means of the formula $P(t_j)=(E(t_j)-E(t_{j-1}))/(t_j-t_{j-1})$. Every reconstructed rectangle will have a horizontal side corresponding to time and a vertical side corresponding to power. In fact, the position in time of the points where energy changes take place (vertices of the rectangles) is given by ($t_i$). The total number of instants $t_i$ determines the number of rectangles. Each duration $\Delta t_i=(t_i-t_{i-1})$ determines the horizontal length of a rectangle. Energy changes $\Delta E(t_i)=E(t_i)-E(t_{i-1})$ determine the heights of the rectangles (from which power is obtained).

The format of the digital message that includes the measurement data comprises at least the following attributes:

a first attribute that distinguishes between the first TDM component, the second EDM component and possibly other components;

a second attribute that indicates the identity of a remote node of the network 15, e.g., the identifier of the measuring device 1;

a time reference of the time measurement instant, or "timestamp";

information about the energy values that have triggered the transmission of the message, such as, for example, one of the following pairs of attributes: $(E_{i-1}, E_i)$; $(E_{i-1}, \Delta E_i)$; $(\Delta E_i, E_i)$;

third attributes allowing transmission of variable-length packets of the measurement data related to the first TDM component and/or the second EDM component.

Optionally, the digital message includes a third attribute for distinguishing between the unicast or groupcast or broadcast communication modes, and the total number of changes that have occurred during a time period.

A measurement data format used in the hybrid method according to the present invention is $E_j=\{MsgType, MeterId_j, [Rcpt_j], E_j(t_k), \Delta E_j(t_k)|E_j(t_{k-1}), t_k, \Delta t_k|t_{k-1}, [Class_j]\}$.

The term MsgType distinguishes between $E^{TDM}$ and $E^{EDM}$ data packets: "MsgType"=$\{TDM, EDM, \ldots \}$.

The term $MeterId_j$ identifies a remote node that originates data: it indicates "where" energy changes are taking place.

The optional term Rcpt identifies the receivers of the unicast/groupcast/broadcast communication. It is useful in order to have pairs of remote nodes, groups thereof, the subnet collectivity, or the whole network 15 cooperate together.

The term $E^{TDM}_j(t_k)$ describes the amounts of energy expressed in (k)Wh detected in a time interval $[0, t_k]$.

The term $\Delta E^{TDM}_{i,j}=E(t_i)-E(t_j)$ quantifies the amount of energy exchanged during a time interval $[t_i, t_j]$.

When MsgType assumes the value TDM, then the value $\Delta E_j$ can be either zero or the difference between two adjacent energy values $E(t_k)$ and $E(t_{k-1})$. In this case, an optional part $[Class_j]$ contains at least the number $n_j$ of intensities of the changes in EDM events that have occurred during the current interval.

Figure 7:
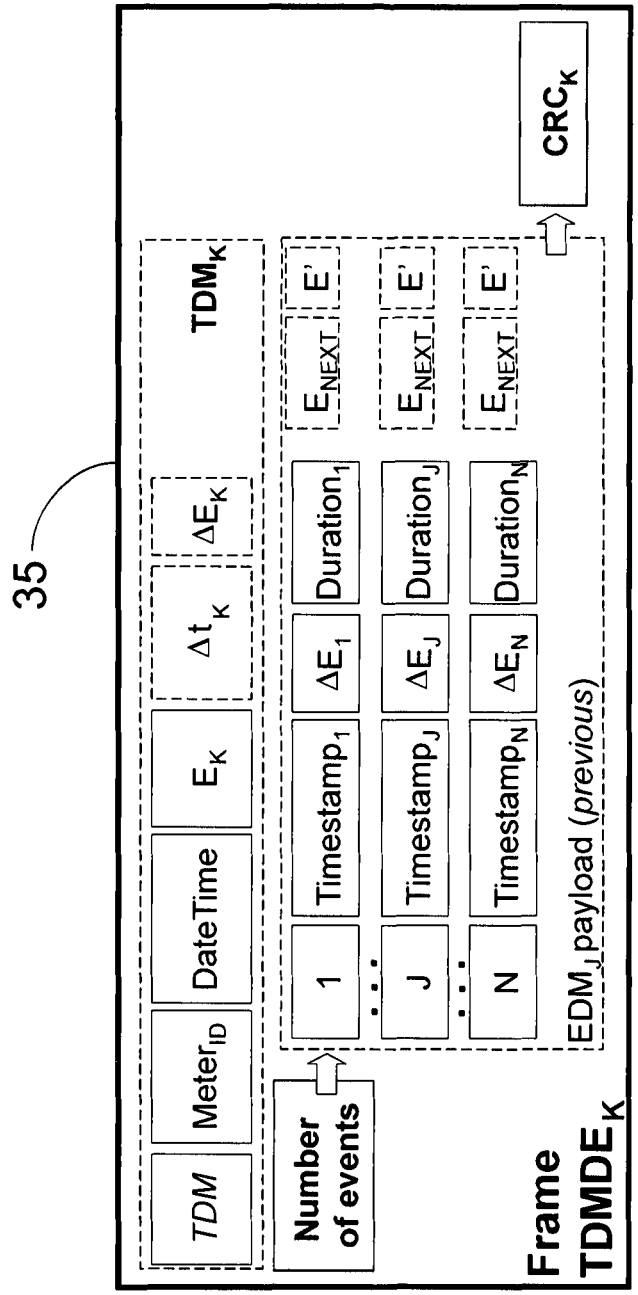
FIG. 7 illustrates an example of a digital message transmitted in an energy distribution network.

With reference to FIG. 7, when MsgType assumes the value TDMDE, then the format of the TDMDE composite message 35 inclusive of both the first TDM measurement component and the second EDM measurement component will vary even further, in that the optional part $[Class_j]$ contains a complex variable-length structure adapted to contain the list of all $n_j$ EDM events that have occurred during the current interval. More precisely, the TDMDE composite message 35 (or TDMDE packet 35) contains a first TDM record as aforementioned, an attribute $N_{ev}$ indicating the number of EDM records that follow in the payload, and then an entire sequence of records $EDM_1, EDM_2, \ldots, EDM_{Nev}$ that have occurred during the interval; all followed by a cyclic redundancy check code $CRC_k$ calculated by means of a standard formula known in the art.

Once the TDMDE composite message 35 has been transmitted (on the remote node side) and/or the third time interval $\Delta t_3$ has ended, the parameters used (by the computer 30) in the cycles are set to the initial values.

The features of the present invention, as well as the advantages thereof, are apparent from the above description.

A first advantage of the method, device and system according to the present invention is that an energy measuring device and an operator of a distribution network can use a communication channel in an extremely efficient manner.

In fact, by exploiting both the first TDM measurement component and the second EDM measurement component, a high sampling frequency is not needed in order to obtain the values $E^{TDM}$, and no duplicate value is repeated.

A second advantage of the method, device and system according to the invention is that the measuring device precisely indicates the time instants of the points in the energy graph where energy level changes occur.

A third advantage of the method, device and system according to the invention is that a number of changes in the flow N is obtained which represents the intensity of the stream of digital messages $E^{EDM}$, which is useful for the purpose of controlling the stability of the network 15.

A further advantage of the method, device and system according to the invention is that they provide an analytical accounting tool for assessing energy utilization in real time. The use of pattern analysis and cluster similarity techniques allows a precise calculation of an energetic profile for a user, who may be supplied with energy at a customized price.

The method, device and system of the present invention are usable by an operator of an energy distribution network at any level, owners of renewable energy production sites, and various participants in the value chain within the energy domain. One possible particular application may consist of ensuring efficient management of processes for charging/recharging electric vehicles, by capturing and identifying connection/disconnection and charge/inactivity/discharge operations.

The method, device and system for measuring the dynamics of a flow of energy may be subject to many possible variations without departing from the novelty spirit of the inventive idea; it is also clear that in the practical implementation of the invention the illustrated details may have different shapes or be replaced with other technically equivalent elements.

It can therefore be easily understood that the present invention is not limited to a method, a device and a system for measuring the dynamics of a flow of energy, but may be subject to many modifications, improvements or replacements of equivalent parts and elements without departing from the novelty spirit of the inventive idea, as clearly specified in the following claims.

The invention claimed is:

1. A method for measuring a measurable flow of energy, said method comprising:

measuring, by means of a measuring device belonging to a distribution network, a first TDM (time driven) measurement component at predetermined intervals, said first TDM measurement component comprising measurement data related to physical parameters of said measurable flow of energy;

measuring, by means of said measuring device, at least one second EDM (event driven), measurement component upon an occurrence of a change in at least one of the physical parameters of said measurable flow of energy, said at least one second EDM measurement component comprising measurement data related to said physical parameters of said measurable flow of energy;

combining said first TDM measurement component and said at least one second EDM measurement component into a time sequence; and controlling an energy trend of said measurable flow of energy in said distribution network based on the time sequence such that causes of imbalance in the distribution network are managed in real-time,
wherein, when transmitting a second TDM measurement component, the second TDM measurement component accounts for second EDM measurement components that have been lost.

2. The method according to claim 1, said method comprising the steps of:
sampling said measurable flow of energy by means of said measuring device;
calculating, at first regular time intervals $\Delta t_1$, integral sums $ETDM_i$ of said first TDM measurement component;
transmitting a digital TDM message in said network by means of said measuring device;
calculating in real time an energy change $\Delta Ei=(E_i-E_{i-1})/\Delta t_2$, where $E_i$ and $E_{i-1}$ are two values of integral sums of amounts of energy consolidated in a determined number of cycles, and where $\Delta t2$ represents a second time interval between respective time instants when said two values of integral sums Ei and E $E_{i-1}$ are obtained, and wherein $\Delta t_2 \ll \Delta t_1$;
adding said energy change $\Delta E_i$ to similar changes calculated at previous time instants in order to obtain an accumulated sum of said changes;
transmitting said second EDM measurement component in said network by means of said measuring device in case said energy change $\Delta E_i$ and/or said accumulated sum are higher than a predetermined threshold value $\delta E$;
iterating said previous steps of the measurement method for each index i and j in order to obtain a time sequence of hybrid values containing both said first TDM measurement component and said second EDM measurement component.

3. The method according to claim 1, wherein said time sequence of values is obtained in real time.

4. The method according to claim 1, wherein said measuring device stores said at least one second EDM measurement component into its own memory means and transmits them a posteriori, together with said first TDM measurement components, to a computer adapted to reconstruct a load shape of said flow of energy in a correct time sequence.

5. The method according to claim 4, wherein said at least one second EDM measurement component comprises time-related meta-information necessary for reconstructing said correct time sequence of events occurred in said load shape.

6. The method according to claim 4, wherein said method provides for defining an intensity parameter of said changes of flow, which is provided together with data packets related to the first TDM measurement component.

7. The method according to claim 1, wherein at every change occurring in said flow of energy a counter is incremented for calculating a total number of changes occurred during a time period.

8. The method according to claim 1, wherein said measuring device and/or a computer examine the trend over time of messages comprising said values related to said physical parameters of said flow of energy, calculating an intensity of the stream of messages, defined as a number of events produced or received during a time slot.

9. The method according to claim 1, wherein said method provides for calculating, by means of said measuring device, changes between energy differences $\Delta E(t_k)/(t_k-t_{k-1})$ and $\Delta E(t_{k-1})/(t_{k-1}-t_{k-2})$ at adjacent time instants $t_k$, the index k ranging from 1 to $\infty$.

10. The method according to claim 1, further comprising generating a message, wherein said message comprises:
a first attribute that distinguishes between said first TDM component and said second EDM component;
a second attribute denoting the identity of a remote node of said network, in particular an identifier of said measuring device;
a time reference of a time measurement instant, or a timestamp;
information about the values of said physical parameters that have triggered the transmission of said message;
third attributes allowing transmission of variable-length packets of said measurement data related to said first TDM component and/or said second EDM component.

11. The method according to claim 10, wherein said message further comprises:
a third attribute for distinguishing between a unicast or groupcast or broadcast communication mode;
a total number of changes in at least one of the physical parameters of said measurable flow of energy that occurred during a time period.

12. The method according to claim 1, wherein said method provides for eliminating a repeated transmission of said data related to physical parameters of said measurable flow of energy, if duplicated.

13. A device for measuring a flow of energy, the device comprising:
means for detecting a value of a physical parameter of said flow of energy;
a communication unit adapted to transmit messages;
a digital measurement circuit;
said device being adapted to:
measure a first TDM (time driven) measurement component at predetermined intervals, said first TDM measurement component comprising data related to physical parameters of said flow of energy;
measure at least one second EDM (event driven) measurement component upon the occurrence of a change in at least one of the physical parameters of said flow of energy, said at least one second EDM measurement component comprising measurement data related to said physical parameters of said flow of energy;
transmit, by said communication unit, said first TDM measurement component and said at least one second EDM measurement component in order to combine them into a time sequence and to control an energy trend of said flow of energy in a distribution network based on said time sequence such that causes of imbalance in the distribution network are managed in real-time,
transmit a second TDM measurement component, wherein the second TDM measurement component accounts for the second EDM measurement components that have been lost.

14. A system for measuring the flow of energy, comprising at least one measuring device according to claim 13 and a computer adapted to reconstruct said time sequence of events occurred in a load shape.

15. The system according to claim 14, wherein said computer is adapted to communicate with control systems and/or state estimators of said distribution network, providing them with a reduced quantity of network information useful for cooperative control of said network, said network information being based on a knowledge of events that occurred on at least one remote node belonging to said distribution network.

\* \* \* \* \*